US006535446B2

(12) United States Patent
Moscaluk

(10) Patent No.: US 6,535,446 B2
(45) Date of Patent: Mar. 18, 2003

(54) TWO STAGE LOW VOLTAGE FERROELECTRIC BOOST CIRCUIT

(75) Inventor: Gary Moscaluk, Divide, CO (US)

(73) Assignee: Ramtron International Corporation, Colorado Springs, CO (US)

(*) Notice: Subject to any disclaimer, the term of this patent is extended or adjusted under 35 U.S.C. 154(b) by 35 days.

(21) Appl. No.: 09/864,851

(22) Filed: May 24, 2001

(65) Prior Publication Data
US 2002/0176304 A1 Nov. 28, 2002

(51) Int. Cl.$^7$ ................................................ G11C 7/00
(52) U.S. Cl. .................... 365/226; 365/145; 365/185.23
(58) Field of Search ................................ 365/226, 145, 365/185.23

(56) References Cited

U.S. PATENT DOCUMENTS

| 4,061,933 A | * 12/1977 | Schroeder et al. ........... 327/161 |
| 5,373,463 A | 12/1994 | Jones, Jr. .................... 365/145 |
| 5,455,786 A | 10/1995 | Takeuchi et al. ............. 365/145 |
| 5,487,029 A | 1/1996 | Kuroda ........................ 365/145 |
| 5,532,953 A | 7/1996 | Ruesch et al. ............... 365/145 |
| 5,539,279 A | 7/1996 | Takeuchi et al. ............. 365/145 |
| 5,550,770 A | 8/1996 | Kuroda ........................ 365/145 |
| 5,579,257 A | 11/1996 | Tai ............................ 365/145 |
| 5,598,366 A | 1/1997 | Kraus et al. ................. 365/145 |
| 5,708,387 A | * 1/1998 | Cleveland et al. ........... 327/536 |
| 5,724,283 A | 3/1998 | Tai ............................ 365/145 |
| 5,751,643 A | * 5/1998 | Lines ....................... 365/189.11 |
| 5,760,497 A | * 6/1998 | Pascucci ..................... 307/110 |
| 5,774,392 A | 6/1998 | Kraus et al. ................. 365/145 |
| 5,903,498 A | * 5/1999 | Campardo et al. .......... 365/185.23 |
| 5,910,911 A | 6/1999 | Sekiguchi et al. ........... 365/145 |
| 5,959,878 A | 9/1999 | Kamp ......................... 365/117 |
| 5,999,461 A | * 12/1999 | Verhaeghe et al. ........ 365/189.11 |
| 6,028,782 A | 2/2000 | Hirano et al. ............... 365/145 |
| 6,031,755 A | 2/2000 | Ozawa ........................ 365/145 |
| 6,097,623 A | 8/2000 | Sakata et al. ................ 365/145 |
| 6,215,329 B1 | * 4/2001 | Campardo et al. ............ 326/88 |
| 6,215,692 B1 | 4/2001 | Kang ........................ 365/145 |
| 6,275,425 B1 | * 8/2001 | Eliason .................. 365/189.11 |

* cited by examiner

Primary Examiner—Michael S. Lebentritt
Assistant Examiner—Tuan T. Nguyen
(74) Attorney, Agent, or Firm—Peter J. Meza, Esq.; William J. Kubida, Esq.; Hogan & Hartson, LLP

(57) ABSTRACT

A low voltage boost circuit suitable for use in a ferroelectric memory is realized implementing five N-channel devices and two ferroelectric capacitors. The voltage on a word line is boosted using charge sharing techniques in order to assure proper operation at lower power supply voltage conditions. In operation, the gate of an N-channel pass gate is boosted to supply a full VDD voltage on the bottom electrode of a ferroelectric capacitor, which capacitively couples into the word line for an efficient word line voltage boost.

19 Claims, 6 Drawing Sheets

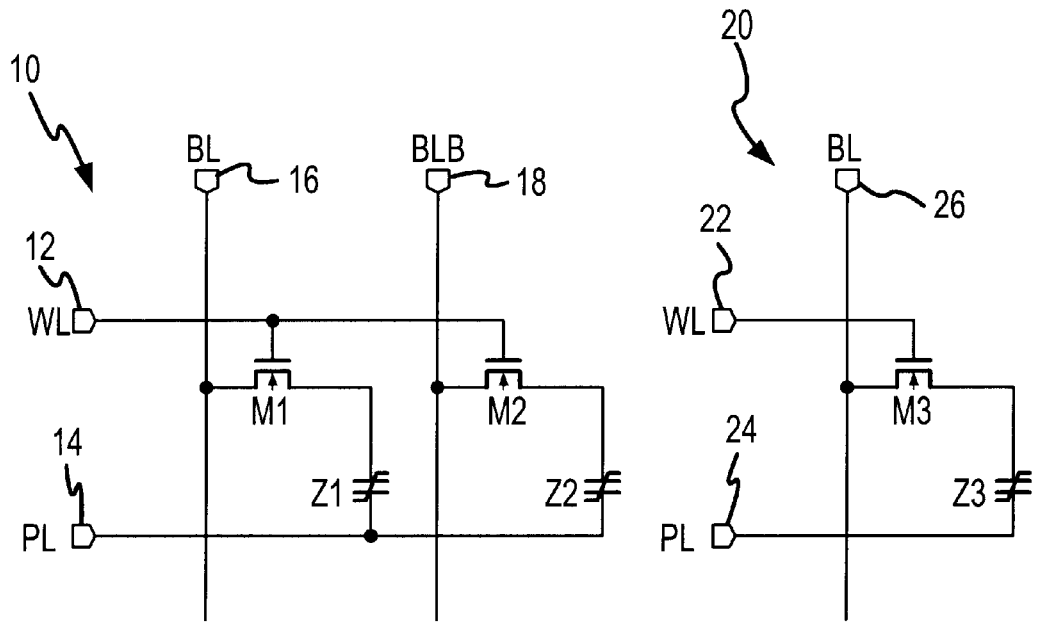
PRIOR ART
FIG.1A
PRIOR ART
FIG.1B
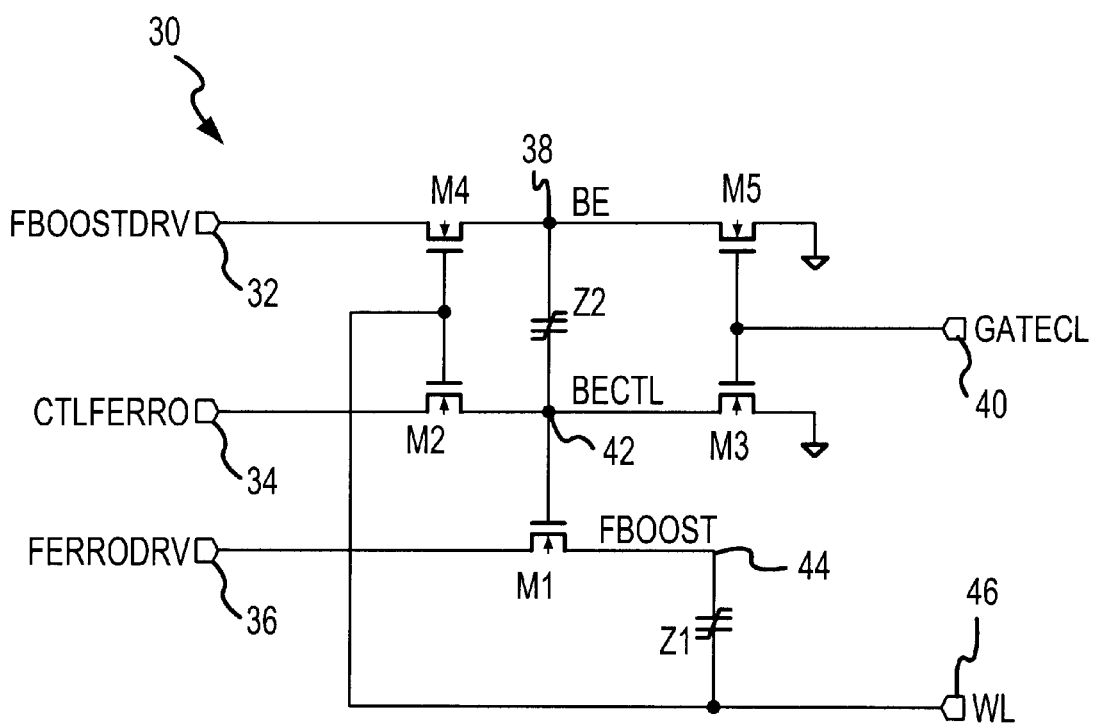
FIG.2

US 6,535,446 B2

TWO STAGE LOW VOLTAGE FERROELECTRIC BOOST CIRCUIT

BACKGROUND OF THE INVENTION

Desirable power supply voltages are becoming lower and lower, tending towards three volts and even lower in some recent applications. The challenge that faces designers of ferroelectric memories is to design solutions that allow the memory cell transistors to operate in the saturation region even at these very low voltages. While advances have been made in ferroelectric thin film technology to enable these ferroelectric materials to operate at low power supply voltages, corresponding advances in ferroelectric memory circuit designs are required as well.

A typical two transistor, two capacitor ("2T/2C") ferroelectric memory cell 10 is shown in FIG. 1A. Ferroelectric memory cell 10 includes two ferroelectric capacitors Z1 and Z2 and two N-channel transistors M1 and M2. A word line 12 is coupled to the gates of transistors M1 and M2, and plate line 14 is coupled to the bottom electrode of ferroelectric capacitors Z1 and Z2. The top electrodes of ferroelectric capacitor Z1 and Z2 are coupled to the source/drains of each of transistors M1 and M2. Two complementary-bit lines 16 and 18 are coupled to the other source/drains of each of transistors M1 and M2. Non-volatile data is stored as a complementary polarization vector in ferroelectric capacitors Z1 and Z2. A typical one transistor, one capacitor ("1T/1C") ferroelectric memory cell 20 is shown in FIG. 1B. Ferroelectric memory cell 20 includes a ferroelectric capacitor Z3 and an N-channel transistor M3. A word line 22 is coupled to the gate of transistor M3, and a plate line 24 is coupled to the bottom electrode of ferroelectric capacitor Z3. The top electrode of ferroelectric capacitor Z3 is coupled to the source/drain of transistor M3. A bit line 26 is coupled to the other source/drain of transistor M3. Non-volatile data is stored as a polarization vector in ferroelectric capacitor Z3.

To ensure the proper operation of ferroelectric random access memory ("FRAM") technology at low power supply voltages, in either a 1T/1C or 2T/2C architecture, the most critical point for retaining data in the ferroelectric capacitors is to make sure that the data that is written to the cell or read from the cell is at the full supply potential.

What is desired, therefore, is a ferroelectric boost circuit for use in either 1T/1C or 2T/2C ferroelectric memory architectures so that none of the limited power supply voltage is lost and the full power supply voltage is written to and read from each ferroelectric memory cell.

SUMMARY OF THE INVENTION

According to the present invention, a low voltage boost circuit suitable for use in a ferroelectric memory is realized implementing five N-channel devices and two ferroelectric capacitors. The voltage on a word line is boosted using charge sharing techniques in order to assure proper operation at lower power supply voltage conditions. In operation, the gate of an N-channel pass gate is boosted to supply a full VDD voltage on the bottom electrode of a ferroelectric capacitor, which capacitively couples into the word line for an efficient word line voltage boost. The advantages of the boost circuit of the present invention are that the circuit operates at low voltages, uses only seven small N-channel devices that can easily fit in pitch, uses no P-channel devices, therefore eliminating the need for large design rule spacings (well-to-well) and has a very fast response time.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 1A is a schematic diagram of a prior art 2T/2C ferroelectric memory cell;

FIG. 1B is a schematic diagram of a prior art 1T/1C ferroelectric memory cell;

FIG. 2 is a schematic diagram of a low voltage ferroelectric boost circuit according to the present invention;

DETAILED DESCRIPTION

Figure 3:
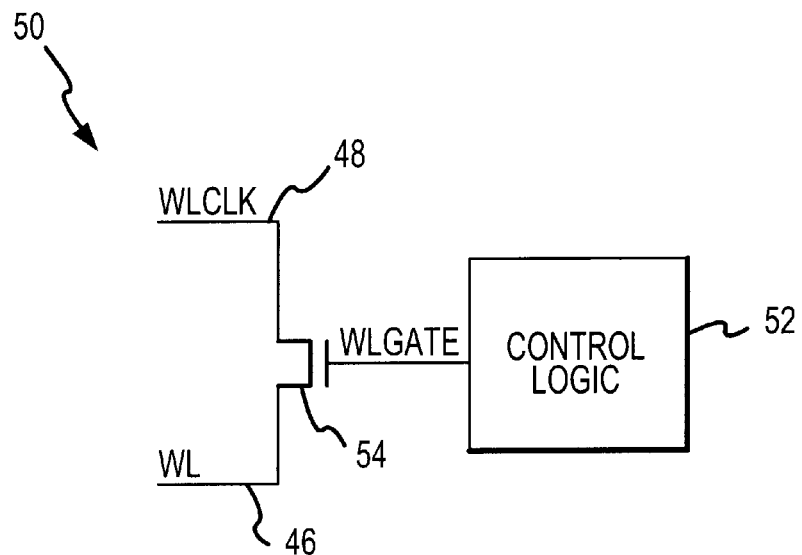
FIG. 3 is a block/schematic diagram of a row decoder used in controlling the timing of the word line signal.

The source and bulk voltages of the ferroelectric memory cell access transistors M1–M3 shown in FIGS. 1A and 1B are not at the same potential, and can be separated by as much as the entire supply voltage if the bulk is grounded. As a result, transistors M1–M3 have a significant body-effected threshold voltage ($V_{tn\ body\text{-}eff}$). Depending on process and temperature variations, the $V_{tn\ body\text{-}eff}$ of these devices can be as much as 1.5 volts. Therefore, in order to provide a full VDD power supply voltage on the top electrode of the ferroelectric capacitors Z1–Z3, the word line (WL) 12 and 22 is ideally boosted to at least VDD+1.5 v in order to operate the N-channel access devices M1–M3 in saturation. This voltage boosting function is provided by the boost circuit of the present invention, which is described in further detail below.

Circuit 30 shown in FIG. 2 is called a "two stage low voltage ferroelectric boost circuit", which essentially boosts the WL 46 to the appropriate voltage level for a full VDD supply voltage on the top electrode of the ferroelectric memory cell capacitor, such as capacitors Z1–Z3 shown in FIGS. 1A and 1B.

Circuit 30 includes an N-channel transistor M1, which has a current path coupled between node 36 (FERRODRV) and node 44 (FBOOST). The gate of transistor M1 is coupled to node 42 (BECTL). N-channel transistor M2 has a current path coupled between node 34 (CTLFERRO) and node 42, and a gate coupled to the WL at node 46. N-channel transistor M3 has a current path coupled between node 42 and ground, and a gate coupled to node 40 (GATECTL). N-channel transistor M4 has a current path coupled between node 32 (FBOOSTDRV) and node 38 (BE), and a gate coupled to node 46. N-channel transistor M5 has a current path coupled between node 38 and ground, and a gate coupled to node 40. A first ferroelectric capacitor Z1 is coupled between nodes 44 and 46, and a second ferroelectric capacitor Z2 is coupled between nodes 38 and 42.

In the off state, the FBOOSTDRV, CTLFERRO and FERRODRV signals are all at VSS whereas the GATECTL signal is at VDD. This ensures that BE and BECTL at nodes 38 and 42 are at VSS. Furthermore, transistors M2 and M4 are in cutoff since the WL is also at VSS.

The circuit that drives the WL initially to VDD, is shown in FIG. 3. Word line driver or row decoder circuit 50 includes a control logic circuit 52, which produces a WLGATE signal that drives the gate of N-channel transistor 54. The current path of transistor 54 is coupled between nodes 46 (WL) and 48 (WLCLK).

Before the WL boosting can occur, circuit 50 first drives the WL to the VDD voltage level. Initially, the WL, WLCLK, and WLGATE signals are all at the VSS voltage level. Once a particular row in the memory array is selected, the WLGATE node is driven to at least a voltage of $VDD-V_{tn}$ by control logic block 52. A short time later, WLCLK is driven to VDD, which couples into the WLGATE node via the gate-to-drain overlap of the N-channel device 54, allowing WLGATE to boost well above VDD and thus drive the WL to the full VDD potential.

Referring to FIGS. 2 and 3, before the boosting of the WL word line can take place once the word line is at VDD, the FBOOST node 44 is ideally discharged due to the coupling of the WL into the FBOOST node via ferroelectric capacitor Z1 and the action of the WLCLK signal going high. This is accomplished by forcing the CTLFERRO signal high followed by driving the FBOOSTDRV signal high a very short time later. The reason that it is important that FBOOSTDRV follow CTLFERRO is that it is not advantageous to switch any dipoles of ferroelectric capacitor Z2, even by a few hundred millivolts, when using boosting capacitors. If switching does occur, this can lead to fatigue of the ferroelectric capacitor, which decreases the life of the capacitor and affects boosting. Thus, it is important from a reliability stand-point that these boosting ferroelectric capacitors operate in the linear region of the ferroelectric capacitor hysteresis loop versus the non-linear region thereof.

Figure 4:
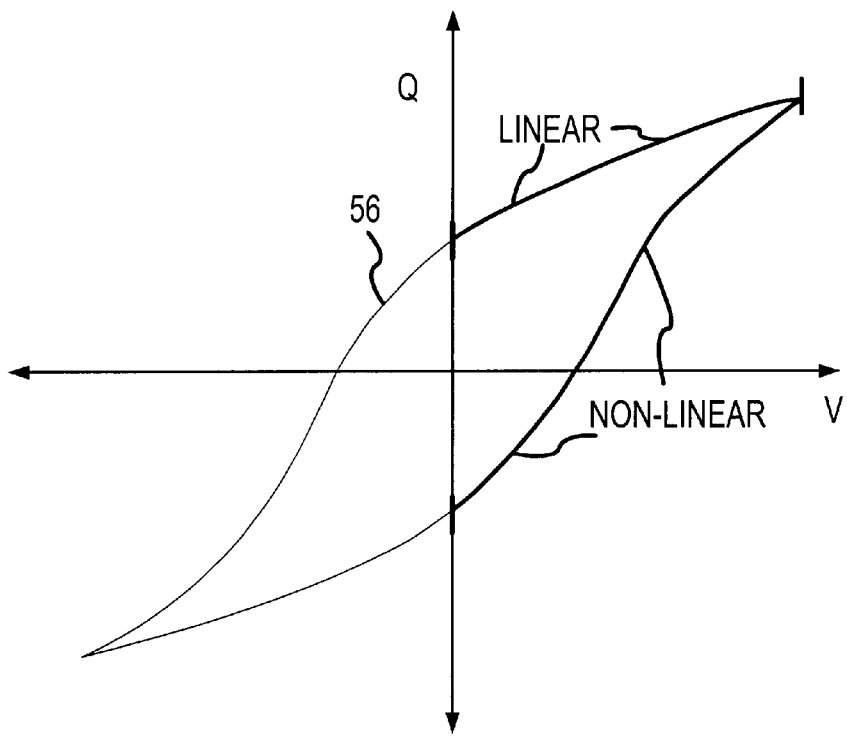
FIG. 4 is a typical hysteresis loop of a ferroelectric capacitor showing in particular the linear and non-linear portions of the loop.

A typical ferroelectric capacitor hysteresis loop 56 is shown in FIG. 4 in which voltage (V) is plotted along the X-axis, and charge (Q), is plotted along the Y-axis. Since capacitance is equal to charge divided by voltage, the amount of capacitance that is available for boosting is:

$$C=\Delta Q/\Delta V$$

which is the change in charge divided the change in voltage. For example, assume that the change in charge is $10\,\mu C/cm^2$ and the change in voltage is 3 volts, then the capacitance for a $20\,\mu m^2$ ferroelectric capacitor is 670 ff.

Referring again to FIG. 2, once the CTLFERRO and FBOOSTDRV signals are driven high, the BECTL and BE nodes 42 and 38 are driven to a voltage of $VDD-V_{tn\ body-eff}$ which in turn saturates transistor M1 and discharges the FBOOST node 44 to VSS. After a short time delay, allowing for FBOOST to discharge, FBOOSTDRV is driven back low in preparation for voltage boosting. Since the WL is still being driven by WLCLK, the WL needs to recover from the undershoot that is due to FBOOST being driven low, which couples into the WL and has to be pulled back up to VDD. Therefore, after some predetermined delay, the WL driver transistor 54 (shown in FIG. 3), is turned off and the WL is ready for boosting. At this time, BE is at VSS and BECTL is at $VDD-V_{tn\ body-eff}$. FBOOSTDRV is then driven high and the change in the BE voltage couples into BECTL node 42 via the ferroelectric capacitor Z2, which increases the voltage on the gate of transistor M1 to a voltage of $VDD-V_{tn\ body-eff}+V_{boost1}$. FERRODRV is then driven to VDD which in turn drives FBOOST to approximately VDD and this voltage change is coupled into the WL through ferroelectric capacitor Z1. Once the WL is boosted to its maximum level, FBOOSTDRV is driven back low, followed by CTLFERRO, which prevents switching the ferroelectric capacitor Z2.

Once sensing and restoring the state of the memory ferroelectric capacitors (Z1–Z3 shown in FIG. 1) are completed, then FBOOST node 44 must be discharged before the WL is driven to VSS in order to prevent switching the ferroelectric capacitor Z1, and to prevent fatigue and subsequent reliability issues. Before this sequence takes place, all control signals are at VSS. Therefore, CTLFERRO is driven high, which provides a $VDD-V_{tn\ body-eff}$ on BECTL, turning on transistor M1 and discharging FBOOST. The WL is then driven to VSS via WLCLK followed by CTLFERRO driven low and GATECTL driven high, clamping BE and BECTL to VSS. Referring again to FIG. 2, it is desirable that transistor M3 be made a long length device. There are two reasons for this. One reason is to minimize the possibility of junction breakdown since BECTL can sustain a high voltage, especially at higher supply voltages. The second reason is to slowly turn on the device which decreases the undershoot on BECTL and coupling into FBOOST from parasitic capacitance.

Figure 5:
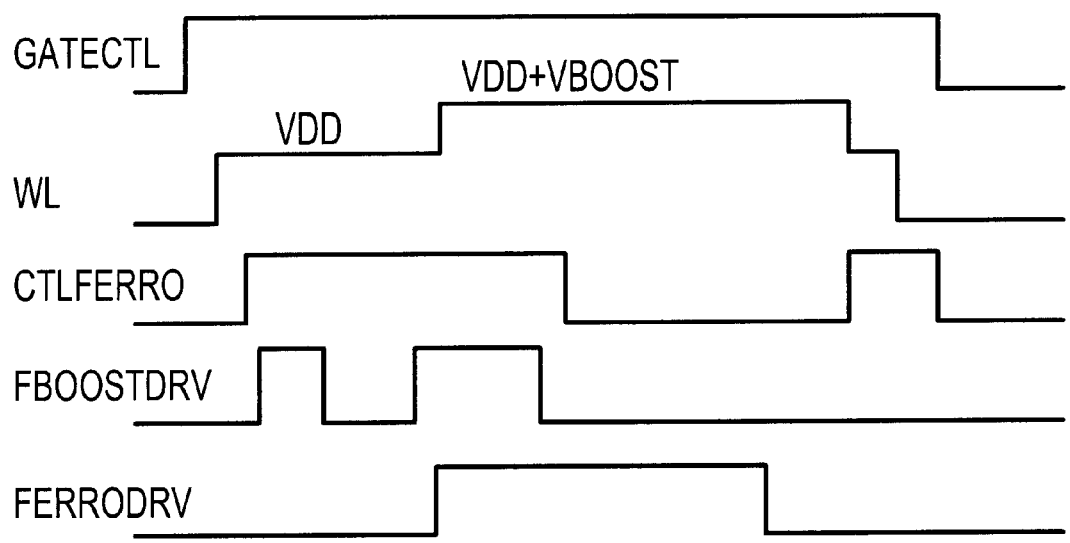
FIG. 5 is a timing diagram showing the word line boost control signal sequence.
Figure 6A:
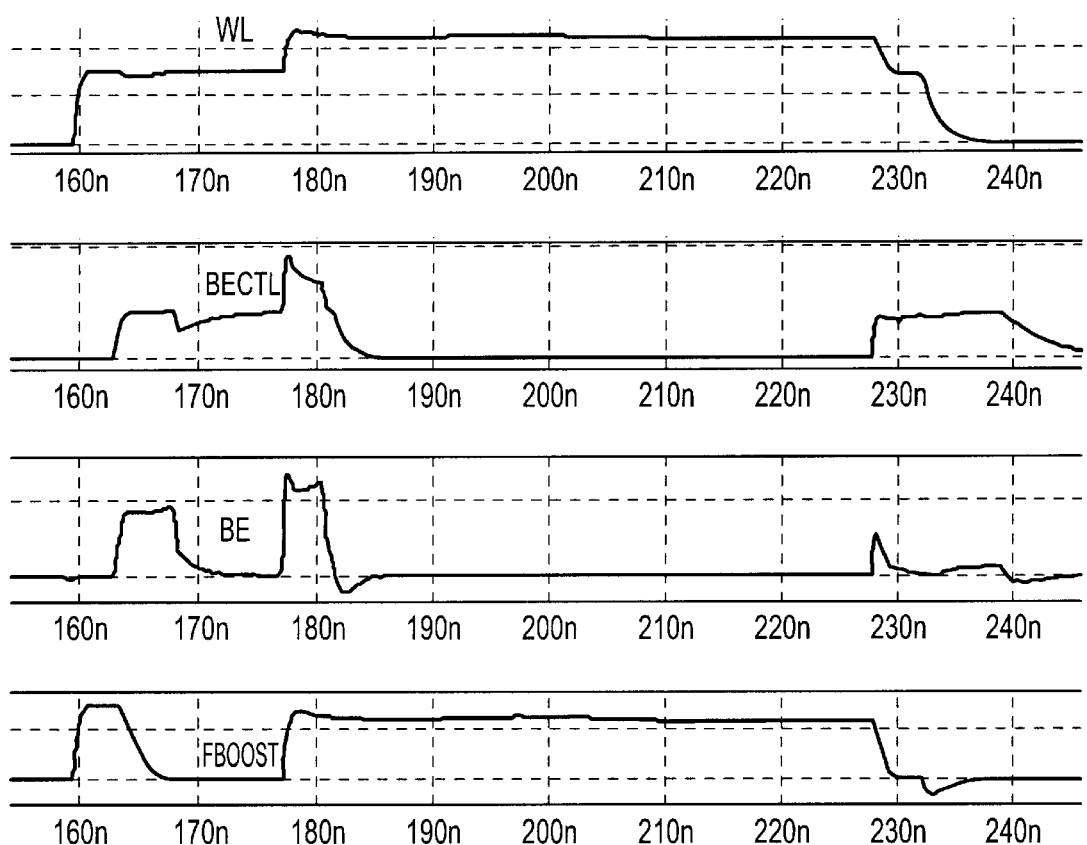
FIGS. 6A and 6B are timing diagrams showing the simulated internal node response of the boost circuit according to the present invention.
Figure 6B:
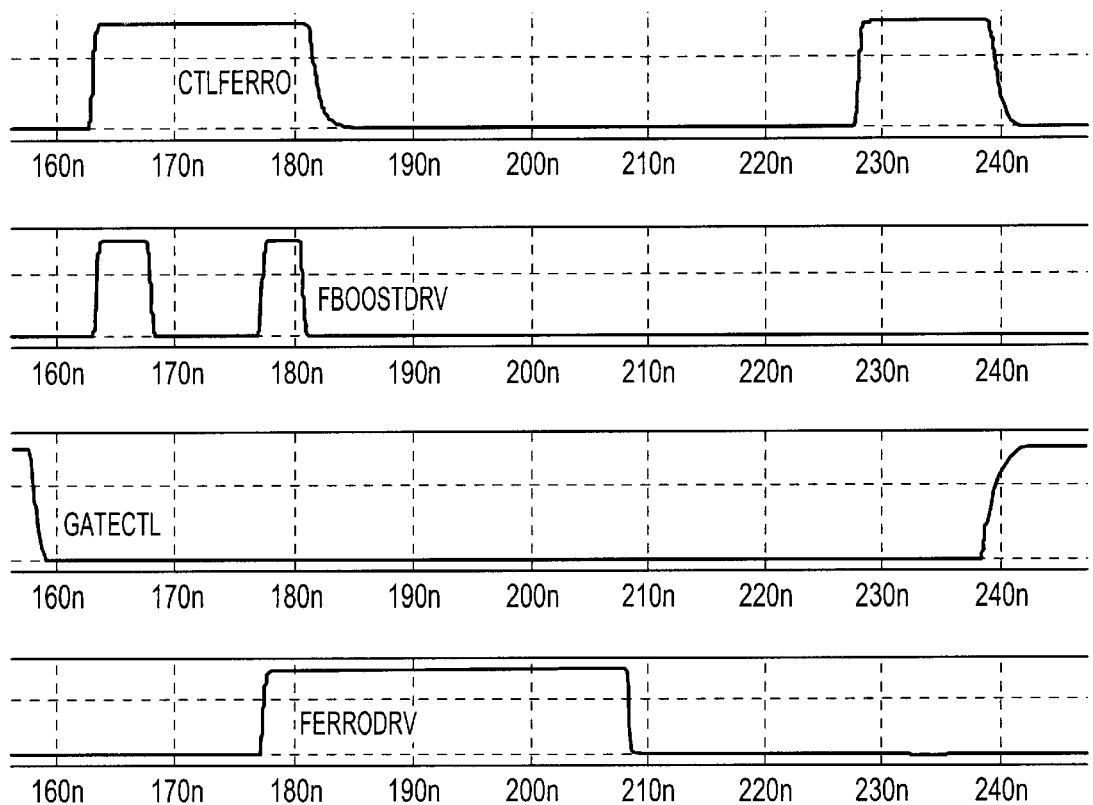

In order to summarize the previous description of the internal circuit nodes and voltages, the following figures show the sequence of events for the control signals and then the two stage ferroelectric boost internal signals. FIG. 5 is a timing diagram that show the timing sequence for the GATECTL, WL, CTLFERRO, FBOOSTDRV, and FERRODRV control signals. FIGS. 6A and 6B are timing diagrams that shows the simulated node voltages for the WL, BECTL, BE, and FBOOST nodes.

Returning to FIG. 2, the FBOOST node 44 is discharged in preparation for boosting. The BECTL node 42 is boosted in order to provide a boosted voltage level that will saturate transistor M1 when the FERRODRV node 36 is driven high to VDD. The charge on FBOOST node 44 is removed without switching ferroelectric capacitor Z1 after WL boosting and prior to precharge. Transistors M3 and M5 are used to hold nodes 38 and 42 (BE and BECTL) low at VSS for unselected word lines which substantially eliminates disturbance problems. Ferroelectric capacitors Z1 and Z2 are operated in the linear portion of the hysteresis loop, which substantially eliminates any fatigue problems associated with switching the capacitors.

To determine the estimated sizes of the boosting capacitors in FIG. 2, there are a few calculations that must be done. For ferroelectric capacitor Z1, which boosts the WL, the total capacitance of the WL must be calculated. If we assume that a 50% boosting efficiency is desired, for a power supply voltage of 3 volts, a 1.5 volt boosting would be required. In other words, the relationship between the WL and the boosting capacitor is determined by charge sharing since there are essentially two capacitors in series. Assuming that the WL has a total of 1.0 pf of capacitance, then for 50% boosting efficiency, the boosting ferroelectric capacitor, Z1, should be equivalent to 1.0 pf. If the linear portion (refer again to FIG. 4) has a capacitance of 100 $ff/\mu^2$, then the size of the boosting capacitor should be $10\,\mu^2$. For ferroelectric capacitor Z2, which boosts BECTL, the efficiency can be much higher since the total capacitance on BECTL is limited to only three devices and parasitic capacitance contributions. Thus, for 90% boosting efficiency and assuming that BECTL has 30 ff of capacitance, the following calculations in equations [1]–[4] are used:

$$C_{fcap}$$
$$(C_{fcap}+C_{tot})=0.9 \qquad [1]$$

$$C_{fcap}=0.9C_{fcap}+0.9C_{tot} \quad [2]$$

$$C_{fcap} 0.9C_{fcap}=0.9C_{tot} \quad [3]$$

$$C_{fcap}=270 \text{ ff} \quad [4]$$

For a linear capacitance term of 100 ff/$\mu^2$, then the size of the ferro capacitor Z2 should be 2.7 $\mu^2$, for a boost of 2.7 v at a supply voltage of 3 v.

Figure 7:
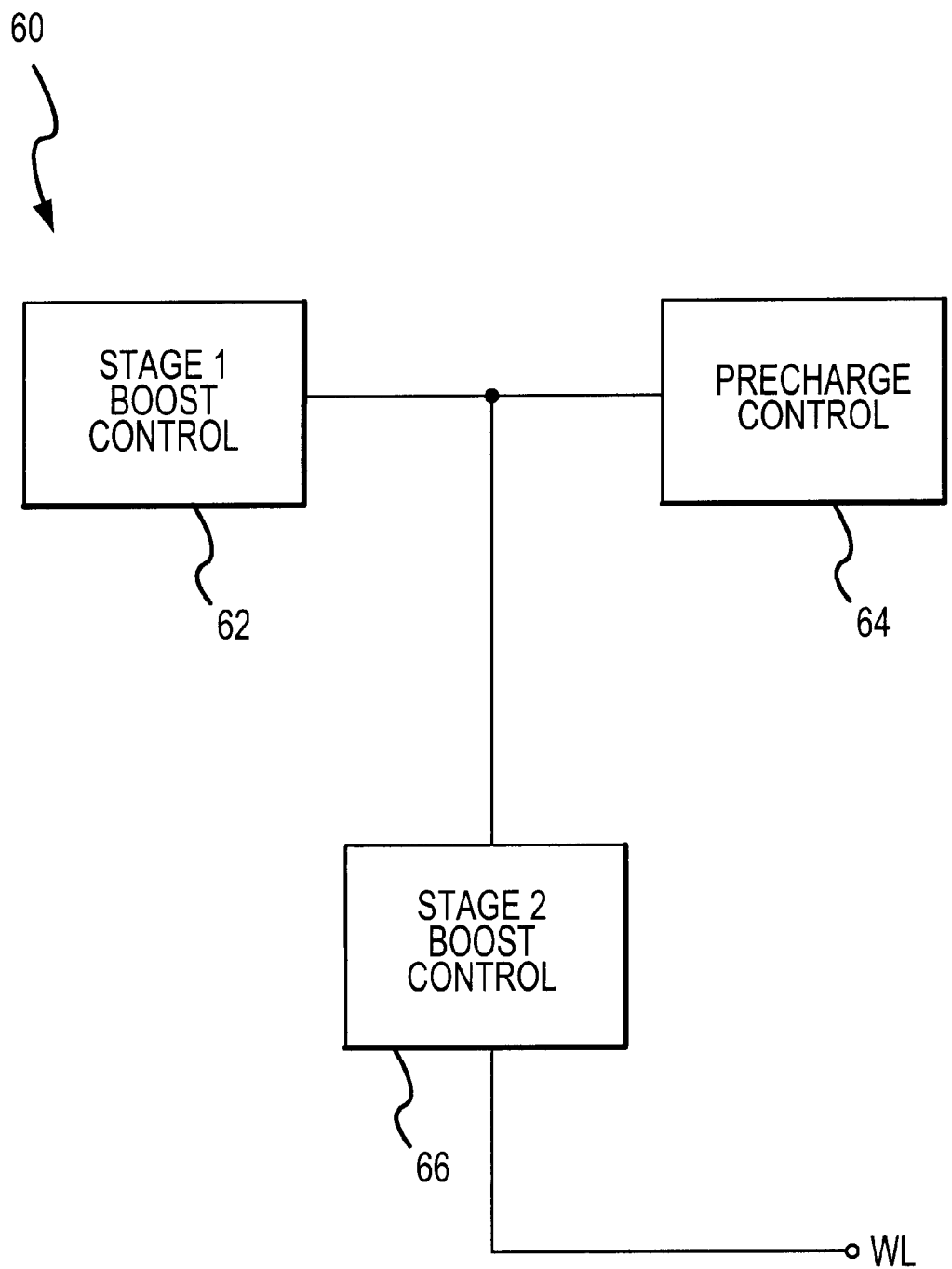
FIG. 7 is a block diagram of the boost circuit according to the present invention.

To aid in the conceptual understanding of the present invention, a block diagram 60 of the boost circuit of the present invention is shown in FIG. 7 in which a first stage boost control circuit block 62 includes transistors M2 and M4 and ferroelectric transistor Z2, a precharge control block 64 includes transistors M3 and M5, and a second stage boost control block 66 includes transistor M1 and ferroelectric capacitor Z1.

The precharge control block 64 essentially prevents the boosting circuit of the present invention from being in any unknown data state by driving the BE and BECTL circuit nodes to VSS when unselected. The first stage boost control block 62 initially boosts the gate of transistor M1, the BECTL node 42, in preparation for boosting the WL via control signals FBOOSTDRV and CTLFERRO. The second stage boost control block 66 actually does the work of boosting the WL since the gate of M1 is at a boosted voltage level and the FERRODRV control signal drives the pass gate transistor M1.

Having described and illustrated the principle of the invention in a preferred embodiment thereof, it is appreciated by those having skill in the art that the invention can be modified in arrangement and detail without departing from such principles. For example, the number of boosting stages, voltage levels, boost ratios, number and nature of the boosting capacitors, polarity of the transistors, and number and nature of the control signals can be changed as desired for a particular low-voltage power supply application. I therefore claim all modifications and variations coming within the spirit and scope of the following claims.

I claim:

1. A boost circuit for boosting an output node voltage comprising:
   a first transistor having a current path coupled between a first node and a second node, and a gate coupled to a third node;
   a second transistor having a current path coupled between a fourth node and the third node, and a gate coupled to the output node;
   a third transistor having a current path coupled between the third node and ground, and a gate coupled to a fifth node;
   a fourth transistor having a current path coupled between a sixth node and a seventh node, and a gate coupled to the output node;
   a fifth transistor having a current path coupled between the seventh node and ground, and a gate coupled to the fifth node;
   a first capacitor coupled between the second node and the output node; and
   a second capacitor coupled between the third node and the seventh node,
   wherein the first, fourth, fifth, and sixth nodes receive control signals.

2. The boost circuit of claim 1 in which the first, second, third, fourth, and fifth transistors each comprise an N-channel transistor.

3. The boost circuit of claim 1 in which the first and second capacitors each comprise a ferroelectric capacitor.

4. The boost circuit of claim 3 in which the first and second ferroelectric capacitors are operated in the linear region.

5. The boost circuit of claim 1 in which the output node is coupled to a word line.

6. The boost circuit of claim 1 in which the second node is discharged in preparation for boosting.

7. The boost circuit of claim 1 in which the third node is boosted to a voltage level that saturates the first transistor when a control signal at the first node is driven high.

8. The boost circuit of claim 1 in which the charge on the second node is removed without switching the first capacitor after the output node is boosted.

9. The boost circuit of claim 1 in which the third and fifth transistors are used to hold the third and seventh nodes low for a predetermined set of operating conditions.

10. A boost circuit for boosting an output node voltage comprising:
    a first stage boost control circuit including a pair of transistors having coupled gates, a first pair of source/drains for receiving control signals, and a second pair of source/drains, and a capacitor coupled between the second pair of source/drains;
    a precharge control circuit coupled to the first stage boost control circuit; and
    a second stage boost control circuit coupled to the first stage boost control circuit, to the precharge control circuit, and to the output node.

11. A boost circuit as in claim 10 in which the output node is coupled to a word line.

12. A boost circuit as in claim 10 in which the pair of transistors comprises a pair of N-channel transistors.

13. A boost circuit as in claim 10 in which the capacitor comprises a ferroelectric capacitor.

14. A boost circuit as in claim 10 in which the precharge control circuit comprises a pair of transistors having coupled gates.

15. A boost circuit as in claim 14 in which the pair of transistors comprises a pair of N-channel transistors.

16. A boost circuit as in claim 10 in which the second stage boost control circuit comprises a transistor having a current path coupled in series to a capacitor.

17. A boost circuit as in claim 16 in which the transistor comprises an N-channel transistor.

18. A boost circuit as in claim 16 in which the capacitor comprises a ferroelectric capacitor.

19. A boost circuit as in claim 16 in which the transistor receives a drive control signal.

* * * * *